(12) United States Patent
Xiong

(10) Patent No.: US 11,315,456 B2
(45) Date of Patent: Apr. 26, 2022

(54) DISPLAY DEVICE AND SHORT CIRCUIT DETECTION METHOD THEREFOR

(71) Applicants: HKC CORPORATION LIMITED, Shenzhen (CN); CHONGQING HKC OPTOELECTRONICS TECHNOLOGY CO., LTD., Chongqing (CN)

(72) Inventor: Zhi Xiong, Shenzhen (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 17/329,463

(22) Filed: May 25, 2021

(65) Prior Publication Data
US 2021/0280106 A1 Sep. 9, 2021

Related U.S. Application Data

(63) Continuation of application No. PCT/CN2020/093760, filed on Jun. 1, 2020.

(30) Foreign Application Priority Data

Jun. 11, 2019 (CN) .......................... 201910503715.1

(51) Int. Cl.
*G09G 3/00* (2006.01)
*G01R 31/52* (2020.01)
*G09G 3/20* (2006.01)

(52) U.S. Cl.
CPC ............. *G09G 3/006* (2013.01); *G01R 31/52* (2020.01); *G09G 3/20* (2013.01);
(Continued)

(58) Field of Classification Search
CPC ......... G09G 2310/0291; G09G 3/3685; G09G 2300/0828; G09G 2310/0289; G09G 2300/0871; G09G 2310/0286
See application file for complete search history.

(56) References Cited

U.S. PATENT DOCUMENTS 6,480,176 B1   11/2002   Lardeau et al.
2007/0080913 A1   4/2007   Park et al.
(Continued)

FOREIGN PATENT DOCUMENTS

CN   101075399 A   11/2007
CN   101174038 A   5/2008
(Continued)

OTHER PUBLICATIONS

First Office Action issued in counterpart Chinese Patent Application No. 201910503715.1, dated Jan. 28, 2021.
(Continued)

*Primary Examiner* — Gerald Johnson
(74) *Attorney, Agent, or Firm* — Westbridge IP LLC

(57) ABSTRACT

A display device and a short circuit detection method therefor are disclosed. The display device comprises: a display panel, a data driving circuit and a scanning driving circuit; the data driving circuit includes a digital-to-analog converter, an amplifier, a switch module and a sensor; an output terminal of the digital-to-analog converter is connected to a data line sequentially via the amplifier and the switch module; the sensor is connected to an external voltage source; and an input terminal and an output terminal of the switching module are disconnected when a feedback voltage received by the sensor is outside of a voltage value range defined by a first voltage source and a second voltage source.

20 Claims, 5 Drawing Sheets

(52) U.S. Cl.
CPC .............. *G09G 2310/027* (2013.01); *G09G 2310/0267* (2013.01); *G09G 2310/0291* (2013.01); *G09G 2330/04* (2013.01)

(56) References Cited

U.S. PATENT DOCUMENTS

| | | | |
|---|---|---|---|
| 2010/0188320 A1* | 7/2010 | Min | G09G 3/3291 |
| | | | 345/80 |
| 2016/0180764 A1* | 6/2016 | Noh | G09G 3/3688 |
| | | | 345/690 |
| 2018/0197485 A1* | 7/2018 | Jose | G09G 3/3614 |
| 2020/0294437 A1* | 9/2020 | Tsuchi | H03M 1/68 |
| 2021/0074198 A1* | 3/2021 | Tsuchi | G09G 3/3685 |

FOREIGN PATENT DOCUMENTS

| | | |
|---|---|---|
| CN | 104318907 A | 1/2015 |
| CN | 104575341 A | 4/2015 |
| CN | 106251798 A | 12/2016 |
| CN | 107305762 A | 10/2017 |
| CN | 107799040 A | 3/2018 |
| CN | 109830214 A | 5/2019 |
| CN | 110264925 A | 9/2019 |

OTHER PUBLICATIONS

Second Office Action issued in counterpart Chinese Patent Application No. 201910503715.1, dated Jun. 3, 2021.
International Search Report and Written Opinion issued in corresponding PCT Application No. PCT/CN2020/093760, dated Jul. 29, 2020.

* cited by examiner

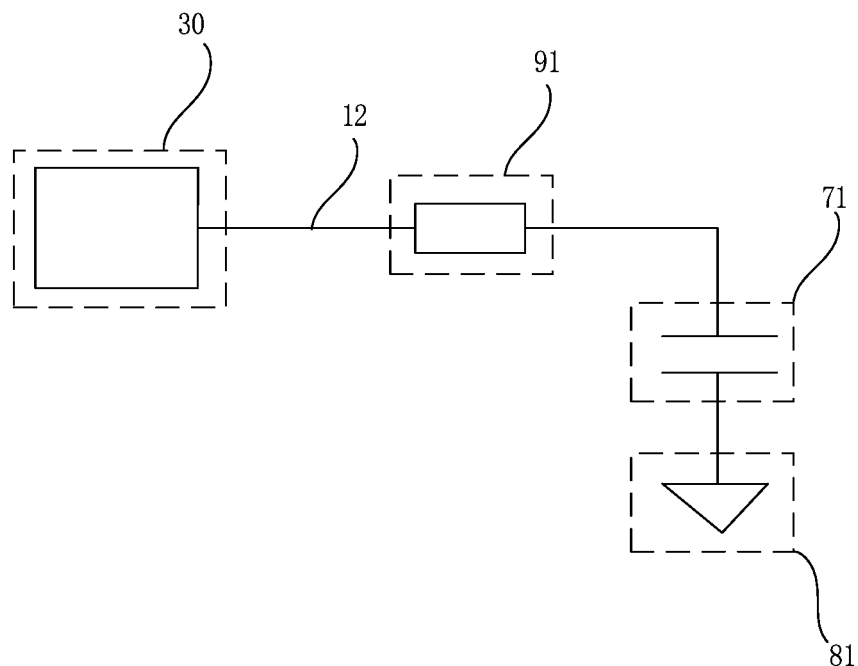

FIG. 4

Determining whether the feedback voltage is outside the voltage value range of the first voltage and the second voltage, after the sensor receives the feedback voltage of the amplifier. —S1

Controlling the output terminal of the sensor to output a high level to the switching module, disconnecting the input terminal and the output terminal of the switching module, in determination that the feedback voltage is outside the voltage value range of the first voltage and the second voltage. —S2

FIG. 5

DISPLAY DEVICE AND SHORT CIRCUIT DETECTION METHOD THEREFOR

CROSS-REFERENCE TO RELATED APPLICATIONS

The present application is a continuation application of International Application No. PCT/CN2020/093760, filed on Jun. 1, 2020, which claims the priority of Chinese application No. 201910503715.1, filed on Jun. 11, 2019, and entitled "Display Device and Short Circuit Detection Method Therefor". The disclosures of the aforementioned applications are hereby incorporated by reference their entireties.

FIELD

The present application relates to the technical field of display devices, in particular to a display device and a short circuit detection method therefor.

BACKGROUND

The statements here provide only background information relevant to this application and do not necessarily constitute prior art.

The display device generally uses a data driver IC as a data driver, which includes a Digital to Analog Converter and a buffer.

When a short circuit occurs between a data line and a scanning line of the display device, there is a conduction path between the data driving chip and the scanning driving chip. Because the working voltage of the scanning driving chip far exceeds the working voltage of the data driving chip, as a result, the data driving chip will burn down under long-term operation.

SUMMARY

The main purpose of the present application is to provide a display device and a short circuit detection method therefor.

In order to achieve the above purpose, a display device proposed in this application includes:

a display panel, where the display panel has a plurality of data lines, a plurality of scanning lines, and pixels formed by intersections of the plurality of data lines and the plurality of the scanning lines;

a scanning driving circuit, where the scanning driving circuit is connected to the plurality of the scanning lines, and for driving the plurality of scanning lines;

a data driving circuit, where the data driving circuit is connected to the plurality of data lines, and for driving the plurality of data lines, the data driving circuit includes a digital-to-analog converter, an amplifier, a switching module and a sensor, an output terminal of the digital-to-analog converter is connected to a data line through the amplifier and the switching module sequentially;

an input terminal of the switching module is connected to the amplifier, and an output terminal of the switching module is connected to the data line;

a first input terminal and a second input terminal of the sensor are connected to an external voltage source, the first input terminal is for receiving a first voltage and the second input terminal is for receiving a second voltage, a voltage value of the first voltage is less than a voltage value of the second voltage, a third input terminal of the sensor is connected between the switching module and the data line, an output terminal of the sensor is connected to a control terminal of the switching module, when a feedback voltage received by the third input terminal is outside a voltage value range defined by the first voltage and the second voltage, the output terminal of the sensor is to output a high level to the control terminal of the switching module, and when the control terminal of the switching module is at the high level, the input terminal and the output terminal of the switching module are disconnected.

In some embodiments, the voltage value of the first voltage is less than an operating voltage of the data driving circuit, and the voltage value of the first voltage is greater than a ground voltage.

In some embodiments, the voltage value of the second voltage is less than the operating voltage of the data driving circuit, and the voltage value of the second voltage is greater than the ground voltage.

In some embodiments, the amplifier is provided with a positive input terminal and an inverting input terminal;

the output terminal of the digital-to-analog converter is connected to the positive input terminal, and the inverting input terminal is connected between the amplifier and the switching module.

In some embodiments, the display device further includes a first storage capacitor and a first common electrode, one terminal of the first storage capacitor is connected to the data line, and the other terminal of the first storage capacitor is connected to the first common electrode.

In some embodiments, the display device further includes a first protection resistor connected between the first storage capacitor and a first data line.

In some embodiments, there are a plurality of first protection resistors, a plurality of first storage capacitors and a plurality of first common electrodes, each of the data lines is provided with a first protection resistor, a first storage capacitor and a first common electrode.

In some embodiments, the display device further includes a second protection resistor, a second storage capacitor and a second common electrode, an output terminal of the scanning driving circuit is connected to one terminal of a scanning line, the other terminal of the scanning line is sequentially connected with the second protection resistor, the second storage capacitor and the second common electrode.

In some embodiments, there are a plurality of second protection resistors, a plurality of second storage capacitors and a plurality of second common electrodes, each of the scanning line is provided with a second protection resistor, a second storage capacitor and a second common electrode.

In some embodiments, a maximum voltage of the output voltage of the scanning driving circuit is greater than the operating voltage of the data driving circuit, a minimum voltage of the output voltage of the scanning driving circuit is less than ground voltage.

In some embodiments, the display device further includes a controller electrically connected to an input terminal of the data driving circuit and an input terminal of the scanning driving circuit respectively.

In some embodiments, the controller is provided separately from the data driving circuit, or the controller is integrally provided with the data driving circuit to form an integrated circuit.

In order to achieve the above purpose, this application also proposes a short circuit detection method of a display device, the short circuit detection method of a display device includes:

determining whether a feedback voltage is outside a voltage value range between a first voltage and a second voltage, after a sensor receives the feedback voltage of an amplifier;

in determination that the feedback voltage is outside the voltage value range between the first voltage and the second voltage, controlling an output terminal of the sensor to output a high level to a switching module, to disconnect an input terminal and an output terminal of the switching module.

In some embodiments, after determining whether a feedback voltage is outside a voltage value range defined by a first voltage and a second voltage, after a sensor receives the feedback voltage of an amplifier, the method further includes:

in determination that the feedback voltage is within the voltage value range defined by the first voltage and the second voltage, controlling the output terminal of the sensor to output a low level to the switching module, to conduct the input terminal and the output terminal of the switching module.

The short circuit detection method of a display device provided by this application can set the sensor inside the data driving circuit. When the voltage output to the data lines is outside the voltage value range of the first voltage and the second voltage, the switching module is controlled to be disconnected between the input terminal and the output terminal, so as to protect the data driving circuit from being burnt out, so as to ensure the normal operation of the display device.

BRIEF DESCRIPTION OF THE DRAWINGS

In order to more clearly explain the technical solution in the embodiments or examples of this application, the following will be a brief introduction to the drawings that need to be used in the embodiments or exemplary description, obviously, the drawings in the following description are only some embodiments of this application, for ordinary skilled in the art, without creative work, other drawings can also be obtained according to these drawings.

FIG. 4 is a diagram of circuit connection between a scanning driving circuit and the scanning lines of the embodiments of this application.

FIG. 5 is a flow chart of steps of a short circuit detection method of an embodiment of this application.

The realization of the purpose, functional characteristics, and advantages of this application will be further described in conjunction with the embodiments and with reference to the accompanying drawings.

DETAILED DESCRIPTION OF THE EMBODIMENTS

Combining with the drawings in the embodiments of this application, the technical solutions in the embodiments of this application are clearly and completely described. Obviously, the described embodiments are only part of the embodiments of this application, instead of all embodiments.

Based on the embodiments in this application, all other embodiments obtained by ordinary skills in the art without creative labor are within the claimed scope of this application.

It should be noted that all directional indications in the embodiments of this application (such as up, down, left, right, front, back . . . ) are only used to explain the relative positional relationship, movement, etc. between components in a specific posture (as shown in the attached FIG). If the specific posture changes, the directional indication changes accordingly.

In addition, the description referring to "first", "second", etc. in this application is only for description purposes, it cannot be understood as indicating or implying the relative importance of the technical features indicated or implicitly indicating the number of the technical features indicated.

Therefore, the features defined with "first" and "second" may explicitly or implicitly include at least one of the features.

In addition, the technical solutions between the various embodiments can be combined with each other, but must be based on the realization of ordinary skills in the art, when the combination of technical solutions is contradictory or impossible to achieve, it should be considered that the combination of such technical solutions does not exist and is not within the claimed scope of this application.

As shown in FIGS. 1 to 4, the present application provides a display device.

Figure 1:
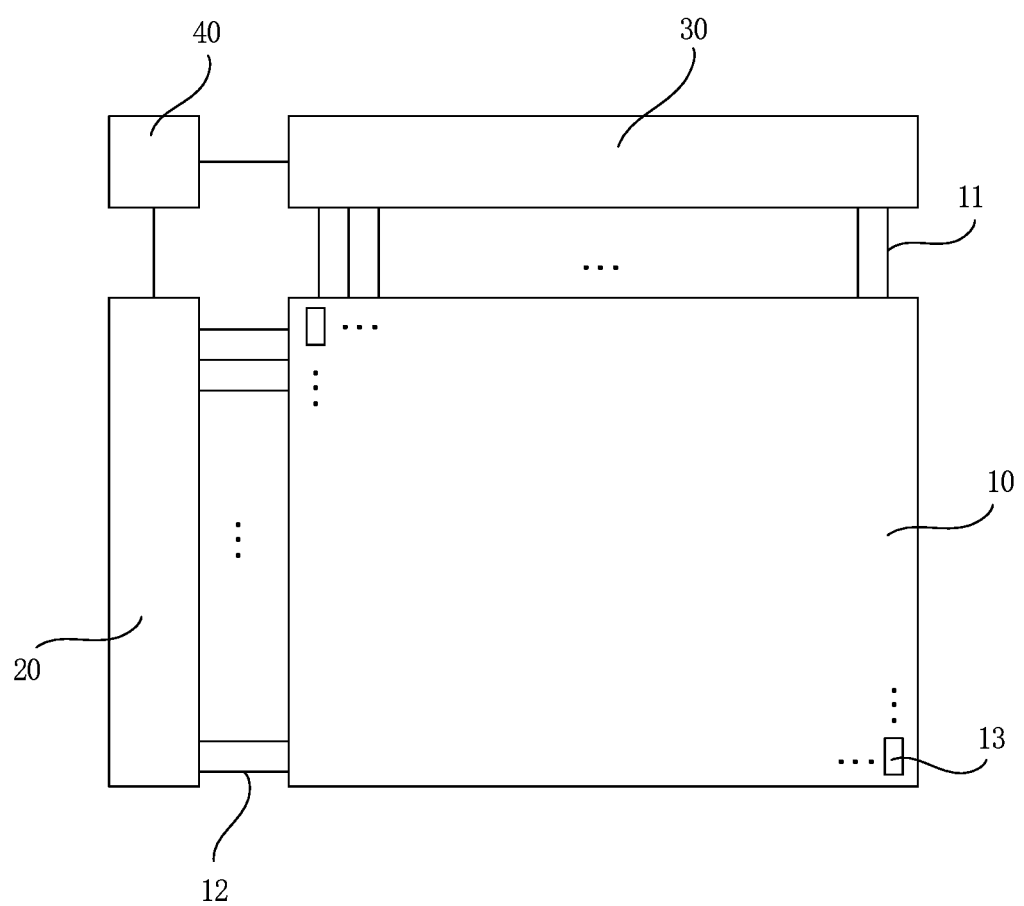
FIG. 1 is a structural diagram of a display device of embodiments of this application.
Figure 2:
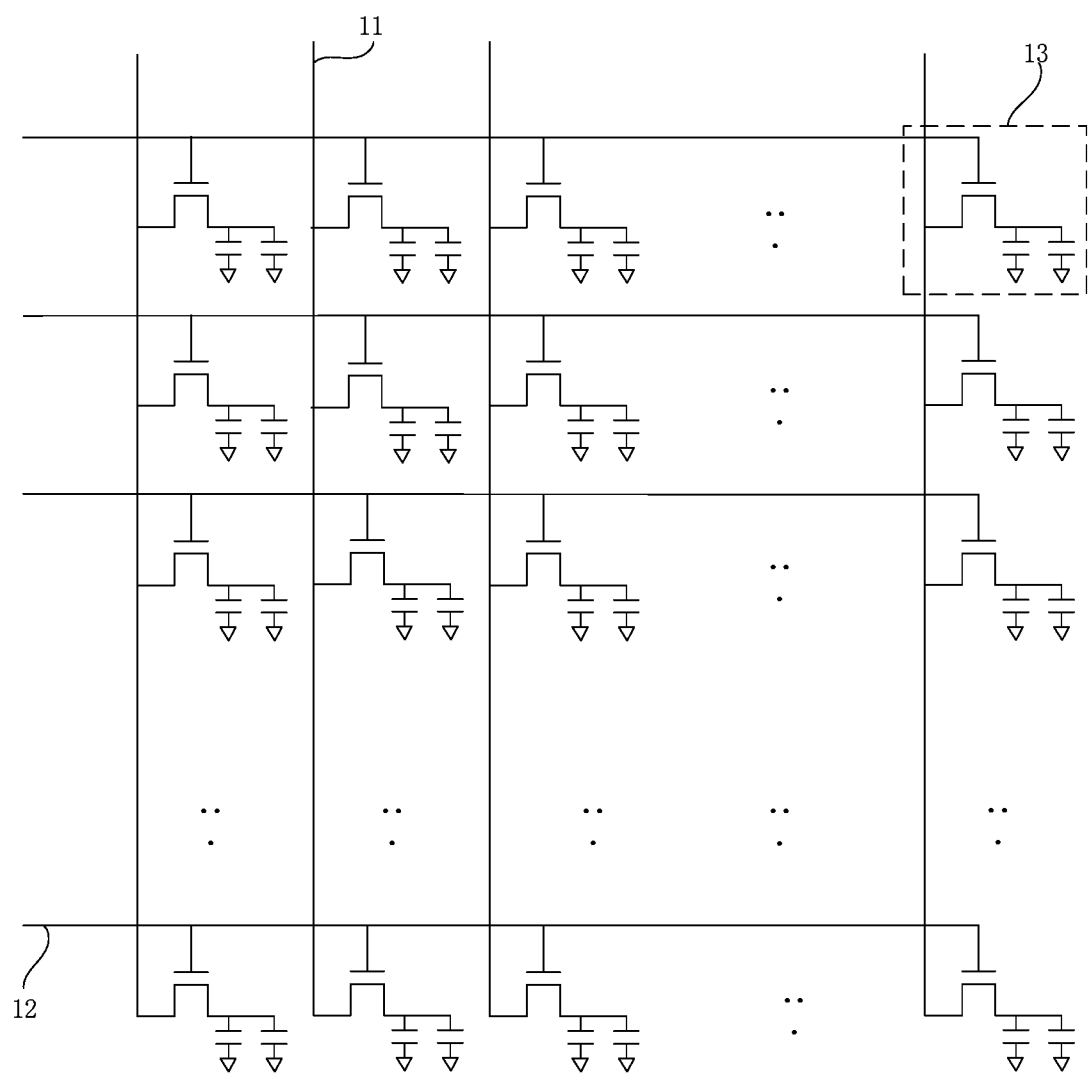
FIG. 2 is a diagram of a distribution of data lines and scanning lines of the embodiments of this application.

In an embodiment, as shown in FIGS. 1 and 2, the display device includes a display panel 10, a scanning driving circuit 30, and a data driving circuit 20. The display panel 10 includes a plurality of data lines 11, a plurality of scanning lines 12 and the pixels 13 formed by the intersections of the plurality of data lines 11 and the scanning lines 12. The scanning driving circuit 30 is connected to the plurality of scanning lines 12, and for driving the plurality of scanning lines 12, the data driving circuit 20 is connected to the plurality of data lines 11 and for driving the plurality of data lines 11.

In an embodiment, the plurality of data lines 11 are arranged in parallel, the plurality of scanning lines 12 are arranged in parallel, and the plurality of data lines 11 are perpendicular to the plurality of scanning lines 12. A pixel 13 is formed between two adjacent data lines 11 and two adjacent scanning lines 12.

After receiving a control signal, the scanning driving circuit 30 and the data driving circuit 20 transmit the control signal to the data lines 11 and the scanning lines 12, and transmit a picture corresponding to the control signal to the pixel 13, the pixel 13 is for displaying the picture corresponding to the control signal.

In some embodiments, because there are a plurality of data lines 11 and scanning lines 12, that is, there are a plurality of pixels 13 formed by the plurality of data lines 11 and the plurality of scanning lines 12. The plurality of pixels 13 are arranged neatly on the display panel 10 to form a display region on the display panel 10, so that a screen can be displayed.

In an embodiment, the display device further includes a controller 40, and the controller 40 is electrically connected to an input terminal of the data driving circuit 20 and an input terminal of the scanning driving circuit 30.

The controller 40 supplies various control signals to the data driving circuit 20 and the scanning driving circuit 30 to control the data driving circuit 20 and the scanning driving circuit 30.

In some embodiments, the controller 40 starts scanning according to a fixed timing implemented in each frame, converts image data input from the outside to be in a data signal format used in the data driving circuit 20, outputs the converted image data, and controls the data driving at appropriate times according to the scanning.

It is appreciated that the controller 40 may be a timing controller or a control device that includes a timing controller and also performs other control functions.

In some embodiments, the controller 40 can be a separate component from the data driving circuit 20, or can be integrated to form one integrated circuit with the data driving circuit 20.

In some embodiments, the data driving circuit 20 provides data voltages to the plurality of data lines 11 for driving the plurality of data lines 11, and the data driving circuit 20 can be a source driver.

The data driving circuit 20 can include at east one source driver integrated circuit for driving the plurality of data lines 11.

In some embodiments, the scanning driving circuit 30 sequentially provides a scanning signal to the plurality of scanning lines 12 for sequentially driving the plurality of scanning lines 12, and the scanning driving circuit 30 can be a gate driver.

The scanning driving circuit 30 can include at least one scanning driving circuit integrated circuit.

The scanning driving circuit 30 sequentially supplies a scanning signal of a turn-on voltage or a turn-off voltage to the plurality of scanning lines 12 according to the control of the controller 40.

When the scanning driving circuit 30 scans a specific scanning line, the data driving circuit 20 converts the image data received from the controller 40 into a data voltage in an analog form, and supplies the data voltage to the plurality of data lines 11.

Figure 3:
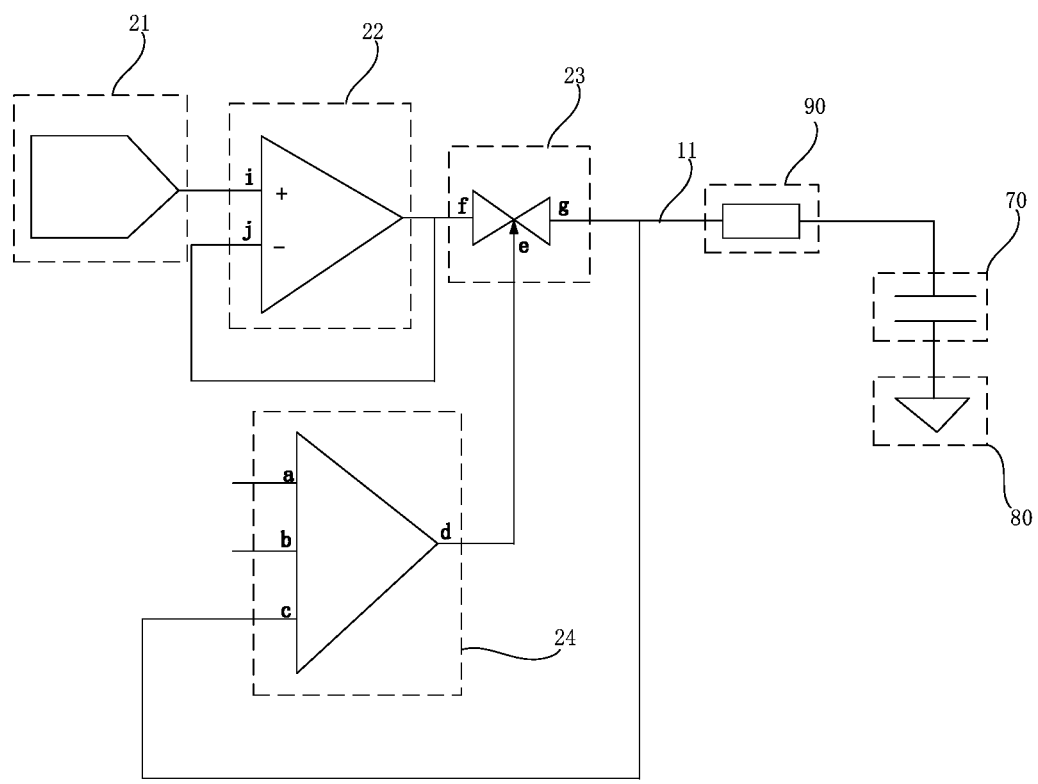
FIG. 3 is a diagram of circuit connection between a data driving circuit and the data lines of the embodiments of this application.

In an embodiment, as shown in FIG. 3, the data driving circuit 20 includes a digital-to-analog converter 21, an amplifier 22, a switching module 23, and a sensor 24, an output terminal of the digital-to-analog converter 21 is sequentially connected to the data line 11 via the amplifier 22 and the switching module 23, an input terminal of the switching module 23 is connected to the amplifier 22, and an output terminal of the switching module 23 is connected to a data line 11.

A first input terminal a and a second input terminal b of the sensor 24 are connected to an external voltage source, and the first input terminal a receives a first voltage and the second input terminal b receives a second voltage. A voltage value of the first voltage is less than a voltage value of the second voltage. A third input terminal c of the sensor 24 is connected between the switching module 23 and the data line 11. An output terminal d of the sensor 24 is connected to a control terminal e of the switching module 23. When a feedback voltage received by the third input c falls out of a voltage value range defined by the first voltage and the second voltage, the output terminal d of the sensor 24 outputs a high level to the control terminal e of the switching module 23. When the control terminal e of the switching module 23 is at a high level, an input terminal f of the switching module 23 and an output terminal g are disconnected.

In one embodiment, a maximum value of an output voltage of the scanning driving circuit 30 is greater than an operating voltage of the data driving circuit 20, and a minimum value of the output voltage of the scanning driving circuit 30 is less than a ground voltage.

The maximum output voltage of the scanning driving circuit 30 is a turn-on voltage of the scanning driving circuit 30, which is much greater than the operating voltage of the data driving circuit 20; the minimum output voltage of the scanning driving circuit 30 is a turn-off voltage of the scanning driving circuit 30, and the turn-off voltage is less than the ground voltage, that is, less than zero.

In some embodiments, the operating voltage of the scanning driving circuit 30 is higher, that is, the higher operating voltage far exceeds the operating voltage of the data driving circuit 20.

When the data lines 11 and the scanning lines 12 are short-circuited, the data driving circuit 20 and the scanning driving circuit 30 are conducted, so that the operating voltage of the scanning driving circuit 30 is applied to the data driving circuit 20, the data driving circuit 20 is easy to be burnt out, resulting in damages to the data driving circuit 20.

In order to prevent the data driving circuit 20 from being damaged, in this embodiment, the sensor 24 is provided in the data driving circuit 20, and its output terminal c receives the voltage that the data driving circuit 20 outputs to the data lines 11, that is, the feedback voltage, and determines whether the feedback voltage is fallen in the voltage value range of the first voltage and the second voltage, so as to confirm whether the data lines 11 and the scanning lines 12 are short-circuited.

In some embodiments, when the feedback voltage is within the voltage value range between the first voltage and the second voltage, the data lines 11 and the scanning lines 12 are not short-circuited, that is, the output terminal d of the sensor 24 outputs a low level to the control terminal e of the switching module 23. When the control terminal e receives the low level, the input terminal f and the output terminal g of the switching module 23 conducted, that is, the display device is in a conducted condition and performs normal display. When the feedback voltage is outside the voltage value range between the first voltage and the second voltage, the data lines 11 and the scanning lines 12 are short-circuited, in order to avoid the data driving circuit 20 to be burnt out, the output terminal d of the sensor 24 outputs a high level to the control terminal e of the switching module 23. When the control terminal e receives the high level, the input terminal f and the output terminal g of the switching module 23 are disconnected, that is, the display device is in an open state.

In this embodiment of the present application, the display device includes a display panel 10, a scanning driving circuit 30, and a data driving circuit 20. The display panel 10 includes a plurality of data lines 11, a plurality of scanning lines 12 and pixels 13 formed by the intersections of the plurality of data lines 11 and the scanning lines 12, the scanning driving circuit 30 is connected to the plurality of scanning lines 12, and for driving the plurality of scanning lines 12, the data driving circuit 20 is connected with a plurality of data lines 11 and for driving the plurality of data lines 11. The data driving circuit 20 includes a digital-to-analog converter 21, an amplifier 22, a switching module 23, and a sensor 24, an output terminal of the digital-to-analog converter 21 is connected to the data lines 11 via the amplifier 22 and the switching module 23 sequentially, an input terminal of the switching module 23 is connected to the amplifier 22, and an output terminal of the switching module 23 is connected to the data lines 11.

A first input terminal a of the sensor 24 is connected to an external voltage source, and the first input terminal a receives a first voltage and a second input terminal b receives a second voltage. A voltage value of the first voltage is less than a voltage value of the second voltage. A third input terminal c of the sensor 24 is connected between the switching module 23 and the data lines 11, and an output terminal d of the sensor 24 is connected to a control terminal e of the switching module 23. In determination that a feedback voltage received by the third input terminal c is outside a voltage value range between the first voltage source and a second voltage source 60, the output terminal d of the sensor 24 outputs a high level to the control terminal e of the switching module 23, in determination that the control terminal e of the switching module 23 is at the high level, the input terminal f and the output terminal g of the switching module 23 are disconnected.

In this way, the technical solution provided by this application can set the sensor 24 inside the data driving circuit 20, in determination that the voltage output to the data line 11 is outside the voltage value range between the first voltage and the second voltage, the input terminal f and the output terminal g of the switching module 23 is controlled to be disconnected, so as to protect the data driving circuit 20 from being burnt out, and so as to ensure the normal operation of the display device.

In one embodiment, a voltage value of the first voltage is less than a operating voltage of the data driving circuit 20, and greater than the ground voltage; the voltage value of the second voltage is less than the operating voltage of the data driving circuit 20, and greater than the ground voltage.

In some embodiments, the operating voltage of the data driving circuit 20 is a voltage capable of maintaining the normal operation of the data driving circuit 20, and the ground voltage is zero.

In an embodiment, in order to ensure the normal operation of the data driving circuit 20, the voltage values of the first voltage and the second voltage are both set to be greater than the ground voltage, and less than the operating voltage of the data driving circuit 20, so that the entire data driving circuit 20 can normally drive the data lines 11.

The voltage value of the first voltage is less than the voltage value of the second voltage.

In some embodiments, the external voltage source is a programmable gamma chip, that is, the programmable gamma chip can provide a gamma low voltage and a gamma high voltage, that is, the first voltage received by the first input terminal a is the gamma low voltage, the first voltage received by the first input terminal b is a gamma high voltage.

Of course, in other embodiments, the external voltage source may also be other equipment or chips or circuits that can provide high and low voltages, and there is no limitation here.

In one embodiment, the amplifier 22 is provided with a positive input terminal i and an inverting input terminal j. The output terminal of the digital-to-analog converter 21 is connected to the positive input terminal i, the inverting input terminal j is connected between the amplifier 2 and the switching module 23.

In some embodiments, the amplifier is to receive and amplify the voltage at the output terminal of the data driving circuit 20, while the inverting input terminal j is connected between the amplifier 22 and the switching module 23, so that the amplifier 22 can be arranged to temporarily store the voltage output from the output terminal of the data driving circuit 20 to the amplifier 22, that is, the amplifier can also implement buffer function, and the amplifier 22 simultaneously realizes the function of amplifying and buffering a signal, thereby reducing the use of components.

In an embodiment, the display device further includes a first storage capacitor 70 and a first common electrode 80. One terminal of the first storage capacitor 70 is connected to the data line 11, the other terminal of the first storage capacitor 70 is connected to the first common electrode 80.

The first storage capacitor 70 may store charge or voltage during the frame time, and/or accelerate a response time of the device.

In some embodiments, in one mode of operation, the data driving circuit 20 may conduct one row at a time in the display device.

The scanning driving circuit 30 may provide data to each pixel 13 of the display device.

When data is supplied from the data driving circuit 20, the data may be stored in the pixels 13 using the first storage capacitor 70.

When the data driving circuit 20 addresses each row, the first storage capacitor 70 may store data for the pixels 13 in the previously addressed row.

For example, the data driving circuit 20 may continue to display the correct color because the data is stored in the first storage capacitor 70.

Data can be maintained at the pixels 13 in a particular row until the row is addressed again, after that, the row of pixels 13 is updated synchronously by row refresh.

In an embodiment, the display device further includes a first protection resistor 90, and the first protection resistor 90 is connected between the first storage capacitor 70 and the data line 11 to protect the connection between the first storage capacitor 70 and the data line 11 from burning out, thereby protecting the structure of the first storage capacitor 70.

In an embodiment, as shown in FIG. 4, the output terminal of the scanning driving circuit 30 is connected to one terminal of each scanning line 12, and the other terminal of the scanning line 12 is sequentially connected with a second protection resistor 91, a second storage capacitor 71 and a second common electrode 81. The functions of the second protection resistor 91, the second storage capacitor 71 and the second common electrode 81 are similar to the functions of the first protection resistor 90, the first storage capacitor 70 and the first common electrode 80, which can make reference to the above description, and will not be repeated here.

In some embodiments, since there are a plurality of data lines 11 and a plurality of scanning lines 12, each of the data lines is provided with a first protection resistor 90, a first storage capacitor 70 and a first common electrode 80, each of the scanning lines 12 is provided with a second protection resistor 91, a second storage capacitor 71, and a second common electrode 81.

Figure 6:
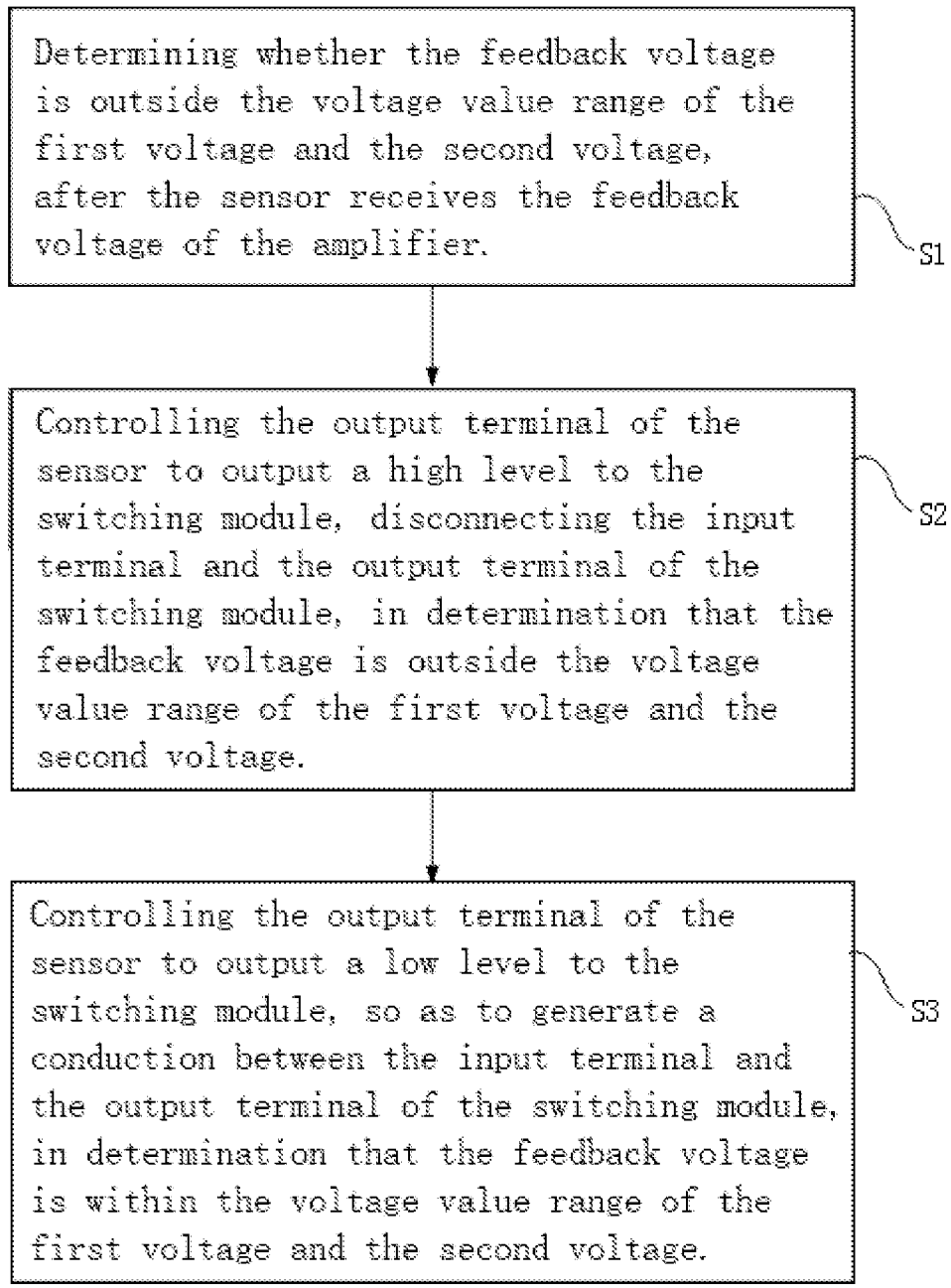
FIG. 6 is a flow chart of steps of a short circuit detection method of another embodiment of this application.

As shown in FIGS. 5 to 6, the present application also provides a short circuit test method of a display device.

In some embodiments, the short circuit test method of a display device is based on the display device of the above embodiments.

In an embodiment, as shown in FIGS. 1 to 4, the display device includes a display panel 10, a scanning driving circuit 30, and a data driving circuit 20. The display panel 10 has a plurality of data lines 11, a plurality of scanning lines 12 and pixels 13 formed by the intersections of the plurality of data lines 11 and the scanning lines 12, the scanning driving circuit 30 is connected to the plurality of scanning lines 12, and for driving the plurality of scanning lines 12, the data driving circuit 20 is connected to the plurality of data lines 11 and for driving the plurality of data lines 11.

In some embodiments, the data driving circuit 20 includes a digital-to-analog converter 21, an amplifier 22, a switching module 23, and a sensor 24, an output terminal of the digital-to-analog converter 21 is connected to the data lines 11 via the amplifier 22 and the switching module 23 sequentially, an input terminal of the switching module 23 is connected to the amplifier 22, and an output terminal of the switching module 23 is connected to the data lines 11.

A first input terminal a of the sensor 24 is connected to an external voltage source, and the first input terminal a receives a first voltage and a second input terminal b receives a second voltage. A voltage value of the first voltage is less than a voltage value of the second voltage. A third input terminal c of the sensor 24 is connected between the switching module 23 and the data lines 11, and an output terminal d of the sensor 24 is connected to a control terminal e of the switching module 23.

As shown in FIG. 5, the short circuit test method of a display device includes:

S1, after the sensor receives a feedback voltage of the amplifier, determining whether the feedback voltage is outside a voltage value range between the first voltage and the second voltage.

In this step, after the sensor 24 receives the feedback voltage of the amplifier 22, that is, the third input terminal c of the sensor 24 receives the feedback voltage of the amplifier 22, whether the feedback voltage is outside the voltage value range between the first voltage source and the second voltage source.

S2, if the feedback voltage is outside the voltage value range between the first voltage and the second voltage, controlling the output terminal of the sensor to output a high level to the switching module, to disconnect the input terminal and the output terminal of the switching module.

In this step, if the feedback voltage is outside the voltage value range between the first voltage and the second voltage, the output terminal d of the sensor 24 outputs a high level to the control terminal e of the switching module 23. When the control terminal e of the switching module 23 is at the high level, the input terminal f and the output terminal g of the switching module 23 are disconnected.

In some embodiments, when the feedback voltage is outside the voltage value range between the first voltage and the second voltage, the data lines 11 and the scanning lines 12 are short-circuited, so as to avoid the data driving circuit 20 from being burnt out, that is, the output terminal d of the sensor 24 outputs a high level to the control terminal e of the switching module 23. After the control terminal e receives the high level, the input terminal f and the output terminal g of the switching module 23 is disconnected, that is, the display device is in an open state.

In the embodiment of the present application, after the sensor receives the feedback voltage of the amplifier, the short circuit test method of a display device determines whether the feedback voltage is outside the voltage value range between the first voltage and the second voltage, and controls the output terminal of the sensor to output a high level to the switching module if the feedback voltage is outside the voltage value range between the first voltage and the second voltage, so that the input terminal and the output terminal of the switching module are disconnected.

In this way, the technical solution provided by this application can set the sensor 24 inside the data driving circuit 20, when the voltage output to the data lines 11 is outside the voltage value range between the first voltage and the second voltage, the input terminal f and the output terminal g of the switching module 23 is controlled to be disconnected, so as to protect the data driving circuit 20 from being burnt out, and so as to ensure the normal operation of the display device.

As shown in FIG. 6, after the step S2, the method also includes:

S3: if the feedback voltage is within the voltage value range between the first voltage and the second voltage, controlling the output terminal of the sensor to output a low level to the switching module, to conduct the input terminal and the output terminal of the switching module.

In this step, when the feedback voltage is within the voltage value range between the first voltage and the second voltage, the data lines 11 and the scanning lines 12 are not short circuited, that is, the output terminal d of the sensor 24 outputs a low level to the control terminal e of the switching module 23. After the control terminal e receives the low level, the input terminal f and the output terminal g of the switching module 23 is turned on, that is, the display device is in the conducted state and can perform normal display.

In this embodiment of the present application, after the sensor receives the feedback voltage of the amplifier, the short circuit test method of the display device determines whether the feedback voltage is outside the voltage value range between the first voltage and the second voltage, and controls the output terminal of the sensor to output a high level to the switching module if the feedback voltage is outside the voltage value range between the first voltage and the second voltage, so that the input terminal and output terminal of the switching module are disconnected, or controls the output terminal of the sensor to output a low level to the switching module if the feedback voltage is within the voltage value range between the first voltage and the second voltage, so that the input terminal and the output terminal of the switching module are conducted.

In this way, the technical solution provided by this application can set the sensor 24 inside the data driving circuit 20, when the voltage output to the data line 11 is outside the voltage value range of the first voltage and the second voltage, the input terminal f and the output terminal g of the switching module 23 is controlled to be disconnected, so as to protect the data driving circuit 20 from being burned out and to ensure a normal operation of the display device. When the voltage output to the data line 11 is within the voltage value range between the first voltage source and the second voltage source 60, the input f and the output terminal g of the switching module 23 are conducted, so as to ensure the normal operation of the display device.

The above are only optional embodiments of this application, and does not therefore limit the scope of the patent of this application, under the idea of this application, any equivalent transformation of using the specification of this application and the contents of the drawings, or any direct/indirect application in other related technical fields is included in the claimed scope of this application.

The invention claimed is:

1. A display device, comprising:
   a display panel, wherein the display panel comprises a plurality of data lines, a plurality of scanning lines, and pixels formed by intersections of the plurality of data lines and the plurality of the scanning lines;
   a scanning driving circuit, wherein the scanning driving circuit is connected to the plurality of the scanning lines, and for driving the plurality of scanning lines;

a data driving circuit, wherein the data driving circuit is connected to the plurality of data lines, and for driving the plurality of data lines, the data driving circuit comprises a digital-to-analog converter, an amplifier, a switching module and a sensor, wherein,
  an output terminal of the digital-to-analog converter is connected to a data line through the amplifier and the switching module sequentially;
  an input terminal of the switching module is connected to the amplifier, and an output terminal of the switching module is connected to the data line;
  a first input terminal and a second input terminal of the sensor are connected to an external voltage source, the first input terminal is for receiving a first voltage and the second input terminal is for receiving a second voltage, a voltage value of the first voltage is less than a voltage value of the second voltage, a third input terminal of the sensor is connected between the switching module and the data line, an output terminal of the sensor is connected to a control terminal of the switching module,
wherein, when a feedback voltage received by the third input terminal is outside a voltage value range between the first voltage and the second voltage, the output terminal of the sensor outputs a high level to the control terminal of the switching module, and when the control terminal of the switching module is at the high level, the input terminal and the output terminal of the switching module are disconnected.

2. The display device according to claim 1, wherein the voltage value of the first voltage is less than an operating voltage of the data driving circuit, and the voltage value of the first voltage is greater than a ground voltage.

3. The display device according to claim 2, wherein the voltage value of the second voltage is less than the operating voltage of the data driving circuit, and the voltage value of the second voltage is greater than the ground voltage.

4. The display device according to claim 1, wherein the amplifier is provided with a positive input terminal and an inverting input terminal;
  the output terminal of the digital-to-analog converter is connected to the positive input terminal, and the inverting input terminal is connected between the amplifier and the switching module.

5. The display device according to claim 1, wherein the display device further comprises a first storage capacitor and a first common electrode, one terminal of the first storage capacitor is connected to the data line, and the other terminal of the first storage capacitor is connected to the first common electrode.

6. The display device according to claim 5, wherein the display device further comprises a first protection resistor connected between the first storage capacitor and a first data line.

7. The display device according to claim 6, wherein there are a plurality of first protection resistors, a plurality of first storage capacitors and a plurality of first common electrodes, each of the data lines is provided with a first protection resistor, a first storage capacitor and a first common electrode.

8. The display device according to claim 1, wherein the display device further comprises a second protection resistor, a second storage capacitor and a second common electrode, an output terminal of the scanning driving circuit is connected to one terminal of a scanning line, the other terminal of the scanning line is sequentially connected with the second protection resistor, the second storage capacitor and the second common electrode.

9. The display device according to claim 8, wherein there are a plurality of second protection resistors, a plurality of second storage capacitors and a plurality of second common electrodes, each of the scanning line is provided with a second protection resistor, a second storage capacitor and a second common electrode.

10. The display device according to claim 1, wherein the maximum voltage of the output voltage of the scanning driving circuit is greater than the operating voltage of the data driving circuit, the minimum voltage of the output voltage of the scanning driving circuit is less than ground voltage.

11. The display device according to claim 1, wherein the display device further comprises a controller electrically connected to an input terminal of the data driving circuit and an input terminal of the scanning driving circuit respectively.

12. The display device according to claim 11, wherein the controller is provided separately from the data driving circuit, or the controller is integrally provided with the data driving circuit to form an integrated circuit.

13. A short circuit detection method of a display device, comprising:
  determining whether a feedback voltage is outside a voltage value range between a first voltage and a second voltage, after a sensor receives the feedback voltage of an amplifier;
  in determination that the feedback voltage is outside the voltage value range defined by the first voltage and the second voltage, controlling an output terminal of the sensor to output a high level to a switching module, to disconnect an input terminal and an output terminal of the switching module.

14. The short circuit detection method according to claim 13, wherein after determining whether a feedback voltage is outside a voltage value range between a test voltage and a second voltage, after a sensor receives the feedback voltage of an amplifier, the method further comprises:
  in determination that the feedback voltage is within the voltage value range defined by the first voltage and the second voltage, controlling the output terminal of the sensor to output a low level to the switching module, to conduct the input terminal and the output terminal of the switching module.

15. A display device, comprising:
  a display panel, wherein the display panel comprises a plurality of data lines arranged in parallel, a plurality of scanning lines arranged in parallel, and pixels formed by intersections of the plurality of the data lines and the plurality of the scanning lines;
  a scanning driving circuit, wherein the scanning driving circuit is connected to the plurality of the scanning lines, and for driving the plurality of scanning lines;
  a data driving circuit, wherein the data driving circuit is connected to the plurality of data lines for driving the plurality of data lines, the data driving circuit comprises a digital-to-analog converter, an amplifier, a switching module and a sensor, wherein,
    an output terminal of the digital-to-analog converter is connected to a data line through the amplifier and the switching module sequentially;
    an input terminal of the switching module is connected to the amplifier, and an output terminal of the switching module is connected to the data line;
    a first input terminal and a second input terminal of the sensor are connected to an external voltage source, the first input terminal is for receiving a first voltage and the second input terminal is for receiving a second voltage, a voltage value of the first voltage is less than a voltage value of the second voltage, a third input terminal of the sensor is connected between the switching module and the data line, an output terminal of the sensor is connected to a control terminal of the switching module;

wherein, when a feedback voltage received by the third input terminal is outside a voltage value range defined by the first voltage and the second voltage, the output terminal of the sensor outputs a high level to the control terminal of the switching module, and when the control terminal of the switching module is at the high level, the input terminal and the output terminal of the switching module are disconnected, the voltage value of the first voltage is less than an operating voltage of the data driving circuit and greater than a ground voltage, a maximum voltage of the output voltage of the scanning driving circuit is greater than the operating voltage of the data driving circuit, and a minimum voltage of the output voltage of the scanning driving circuit is less than the ground voltage.

16. The display device according to claim 15, wherein the voltage value of the first voltage is less than an operating voltage of the data driving circuit, and the voltage value of the first voltage is greater than a ground voltage.

17. The display device according to claim 15, wherein the amplifier is provided with a positive input terminal and an inverting input terminal;

the output terminal of the digital-to-analog converter is connected to the positive input terminal, and the inverting input terminal is connected between the amplifier and the switching module.

18. The display device according to claim 15, wherein the display device further comprises a storage capacitor and a common electrode, one terminal of the storage capacitor is connected to a data line, the other terminal of the storage capacitor is connected to the common electrode.

19. The display device according to claim 18, wherein the display device further comprises a protection resistor connected between the storage capacitor and the data line.

20. The display device according to claim 15, wherein the display device further comprises a controller electrically connected to an input terminal of the data driving circuit and an input terminal of the scanning driving circuit respectively.

* * * * *